FIELD EFFECT SEMICONDUCTOR DEVICE HAVING A PROTECTIVE DIODE

Filed March 4, 1968 5 Sheets-Sheet 1

INVENTOR
KOJI USUDA

BY Craig & Antonelli
ATTORNEYS

INVENTOR
KOJI USUDA

BY Craig & Antonelli
ATTORNEYS

INVENTOR
KOJI USUDA

BY Craig & Antonelli
ATTORNEYS

FIELD EFFECT SEMICONDUCTOR DEVICE HAVING A PROTECTIVE DIODE

Filed March 4, 1968 5 Sheets-Sheet 4

INVENTOR

KOJI USUDA

BY Craig & Antonelli

ATTORNEYS

INVENTOR
KOJI USUDA

BY
Craig, Antonelli, Stewart & Hill
ATTORNEYS

United States Patent Office 3,555,374

Patented Jan. 12, 1971

3,555,374

FIELD EFFECT SEMICONDUCTOR DEVICE HAVING A PROTECTIVE DIODE

Koji Usuda, Tokyo, Japan, assignor to Hitachi, Ltd., Tokyo, Japan, a corporation of Japan Filed Mar. 4, 1968, Ser. No. 710,047
Claims priority, application Japan, Mar. 3, 1967, 42/13,079
Int. Cl. H01l 9/00, 19/00
U.S. Cl. 317—235 25 Claims

ABSTRACT OF THE DISCLOSURE

A semiconductor device comprising a semiconductor element having an insulated gate electrode and a protective diode region provided in the neighborhood of the semiconductor element to protect the gate electrode from a dielectric breakdown; the diode is formed by a low resistivity semiconductor material to reduce its internal resistance, thereby accelerating the action of the protective diode so that the clamp action of the diode occurs earlier than the dielectric breakdown of the gate electrode.

This invention relates to an improvement of a semiconductor device having a protective diode to prevent a device from breaking down when an input voltage larger than a prescribed voltage is applied thereto.

In a semiconductor device having an insulated gate electrode such as a well-known MIS (Metal Insulator Semiconductor) type field effect transistor, it is often observed that an insulating layer under the insulated gate electrode breaks down with the application of a strong electric field. It is presumed that such a strong electric field is generated by a surge voltage due to an external noise or a charged human body. As a method of preventing the breakdown phenomenon it is proposed to connect a rectifying element such as a protective diode or a clamp diode to the input circuit of the field effect transistor and clamp the amplitude of the large surge input voltage at a lower level, at least lower than the breakdown voltage of the insulator. However, the function of the protective diode is often ineffective. Hence dielectric breakdowns of the gate insulator have been frequent. Some improvements have been required to protect the breakdown of an MIS type semiconductor device.

Generally, a P channel enhancement mode MIS type field effect transistor comprises P-type source and drain regions in an N-type semiconductor substrate of high resistivity. Another P-type region for a protective diode is formed in the substrate separately from the transistor and is connected to the gate electrode of the transistor by means of an interconnection layer, which extends over an insulating layer disposed on the surface of the substrate. In this case, application of a negative electric potential to the gate electrode induces a P-type conducting channel layer in the surface of the semiconductor substrate underlying the interconnection layer, whereby the P-type diode region is short-circuited to the P-type source or drain region. This may be considered as the parasitic field effect phenomenon. In the case of a P-type semiconductor substrate the channel phenomenon is brought forth by an insulating film, for example, an oxide film. These phenomena should be prevented in order to make the protecting function of the diode perfect.

In order to raise the breakdown voltage of a PN junction formed between the drain region and the substrate, the resistivity of the substrate should be selected high, while in order to obtain a protective diode having a low breakdown voltage it should be selected relatively low. These opposite requirements in regard to resistivity of substrate have made it difficult to manufacture a field effect transistor having an excellent characteristic and a protective diode having a perfect protecting function.

One object of this invention is to provide a field effect semiconductor device with a protective diode having an excellent electric characteristic and stability.

Another object of this invention is to provide a field effect semiconductor device with a protective diode in which the breakdown preventing function of the diode is assured and improved.

A further object of this invention is to provide a field effect semiconductor device with a protective diode in which the bad influence due to the parasitic field effect phenomenon is eliminated.

The gist of this invention is a field effect semiconductor device with a protective diode comprising a semiconductor substrate of first conductivity type having a low resistivity region and a high resistivity region, a field effect semiconductor element with an insulated gate electrode formed at one principal surface of the high resistivity region of the substrate, a protective diode region of second conductivity type formed separately from the semiconductor element in the substrate surface, a first metal electrode fitted to the diode region, a means connecting the first metal electrode with the gate electrode, and a second metal electrode in ohmic contact with the low resistivity region of the substrate, and the low resistivity region being disposed between the first and second metal electrodes so as to decrease the resistance extending from a PN junction between the diode region and substrate toward the second metal electrode.

Concrete embodiments of this invention will be made hereunder with reference to the accompanying drawings.

FIGS. 1*a* and 1*b* are a top side view of a prior art solid circuit means of a field effect transistor having a protective diode and a cross sectional view taken along the line 1*b*—1*b* respectively.

Figure 4A:
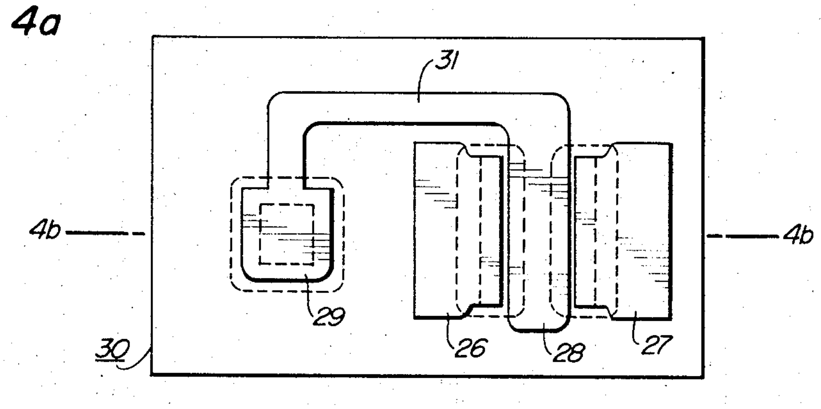
Figure 4B:
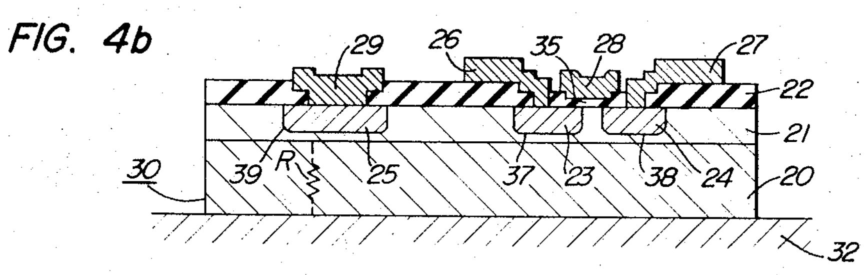

FIGS. 4*a* and 4*b* are a top side view of a circuit means comprising a protective diode and a field effect transistor according to one embodiment of this invention, and a cross sectional view taken along the line 4*b*—4*b*, respectively.

FIGS. 5*a* to 5*d* are cross sectional views showing the manufacturing steps of a circuit means shown in FIGS. 4*a* and 4*b*.

Figure 6A:
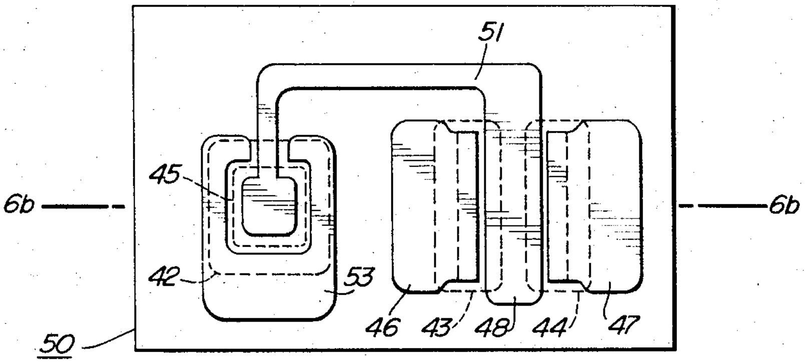
Figure 6B:
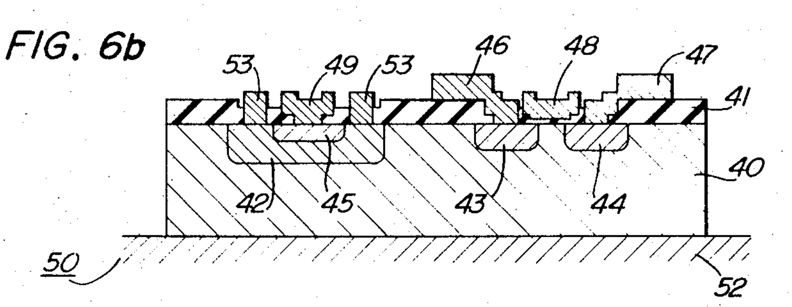

FIGS. 6*a* and 6*b* are a top view of a circuit means according to another embodiment of this invention and a cross sectional view taken along the line 6*b*—6*b*, respectively.

Figure 7:
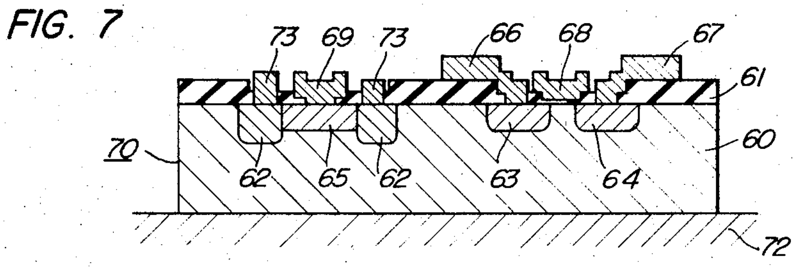

FIG. 7 is a cross sectional view of a modified embodiment of this invention.

FIGS. 8*a* to 8*d* are cross sectional views showing the manufacturing steps of a circuit means shown in FIG. 7.

Figure 9A:
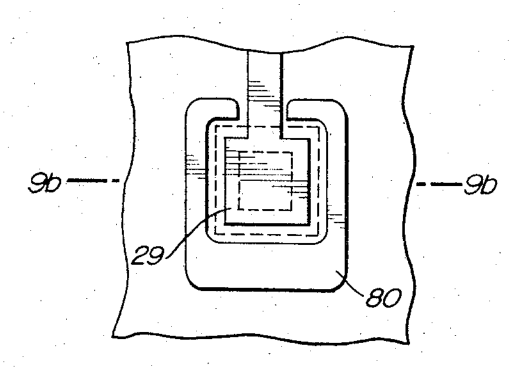
Figure 9B:
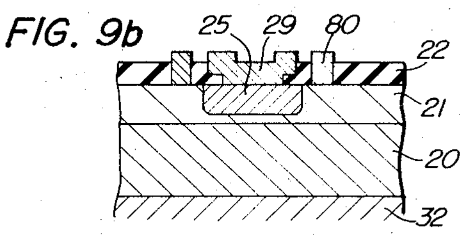

FIGS. 9*a* and 9*b* are a partial top side view of another modified embodiment of this invention and a partial cross sectional view taken along the line 9*b*—9*b*, respectively.

Figure 10:
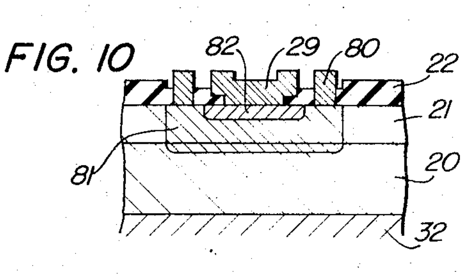

FIG. 10 is a cross sectional view of a further modified embodiment of this invention.

Figure 11:
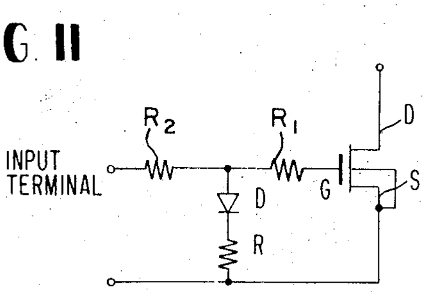

FIG. 11 is a circuit diagram of a further embodiment of this invention.

Figure 12:
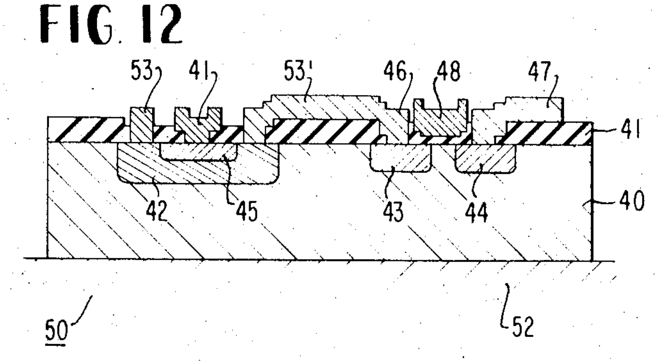

FIG. 12 is a cross section of still a further modified embodiment of this invention.

Figure 1A:
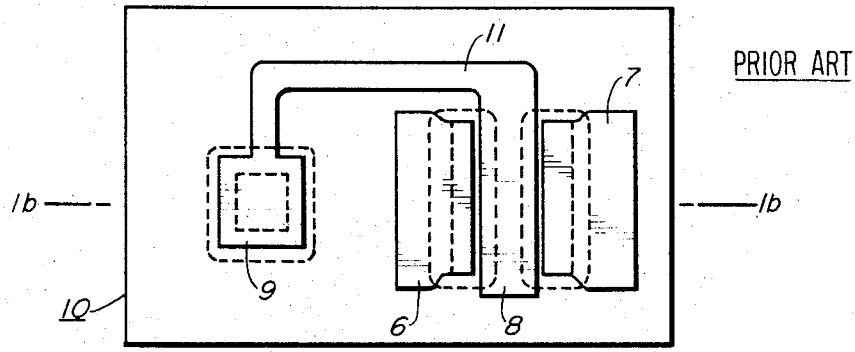
Figure 1B:
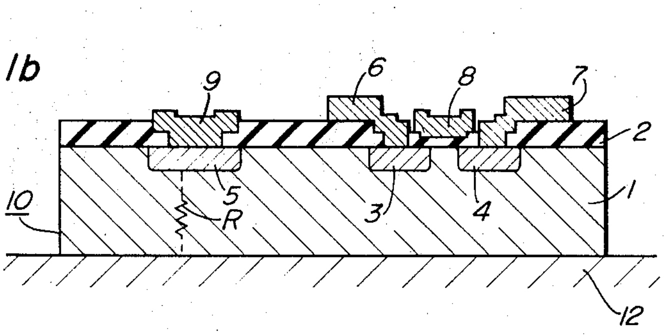
PRIOR ART FIG. 1b

Usually, as shown in FIGS. 1*a* and 1*b*, in order to prevent a surge noise voltage appearing at the insulated gate electrode 8 of the insulated gate field effect transistor 10 from causing a breakdown of the insulating film 2 between the gate electrode 8 and the semiconductor substrate 1 or the source region 3, a clamp protective diode having a breakdown voltage $V_{BD}$ lower than a breakdown voltage $V_{BG}$ of the insulating film 2 is formed in the substrate together with the field effect transistor.

In these figures the substrate 1 is generally N type silicon having a resistivity of 1 to 1.5Ω cm. The P type region 5 is formed simultaneously with the source region 3 and the drain region 4. A PN junction formed between the P type region 5 and the N type substrate 1 serves as the clamp diode. A source electrode 6 and a drain electrode 7, one terminal 9 of the clamp diode, an interconnection layer 11 connecting the terminal 9 with the gate electrode 8, and a substrate electrode 12 in ohmic connection with the substrate are also illustrated in these figures.

Figure 2:
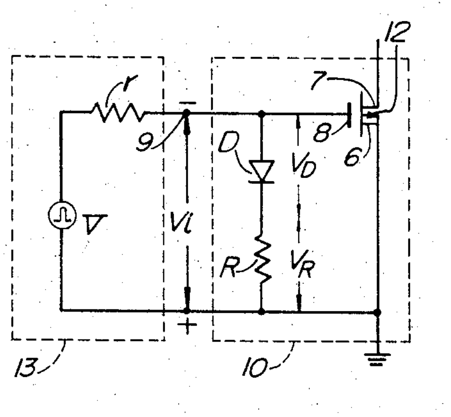
PRIOR ART FIG. 2
FIG. 2 is a rough diagram showing an electric equivalent circuit of a circuit means shown in FIGS. 1*a* and 1*b*.

An equivalent circuit of the above semiconductor device 10 is shown in FIG. 2, in which like reference numerals are used to denote like parts as shown in FIGS. 1*a* and 1*b*.

It is expected from this structure that even if a voltage source 13 giving a higher surge voltage than $V_{BG}$ is applied at the input terminal, the voltage between the gate 8 and the source electrode 6 is clamped at the breakdown voltage $V_{BD}$ of the protective diode. Thus the insulating film 2 under the gate electrode 8 will be protected from breaking down.

On the other hand, the input voltage due to a high surge voltage is actually not clamped at the breakdown voltage $V_{BD}$. The insulating film, therefore, frequently breaks down.

The reasons are thought to be the following:

(1) In the semiconductor device shown in FIGS. 1*a* and 1*b* a spread resistance R of a substrate 1 lies between the substrate electrode 12 and the PN junction portion of the clamp diode, which is formed between the region 5 and the substrate 1. (In a strict sense the resistance R includes the spread resistance as well as the wiring resistance and the contact resistance at the electrodes.) When a surge noise source 13 having an internal resistance $r$ is applied, the voltage drop across the resistance R is not negligible unless $r$ is much larger than R. Therefore, the voltage between the gate and source electrodes is not clamped substantially at the breakdown voltage $V_{BD}$ of the clamp diode. The surge voltage V is almost directly applied to the gate electrode. Thus the insulating film between the gate electrode and the semiconductor substrate (specifically between the gate electrode and the source region) breaks down. The resistance R in a prior art becomes about 500 to 1000Ω.

Figure 3:
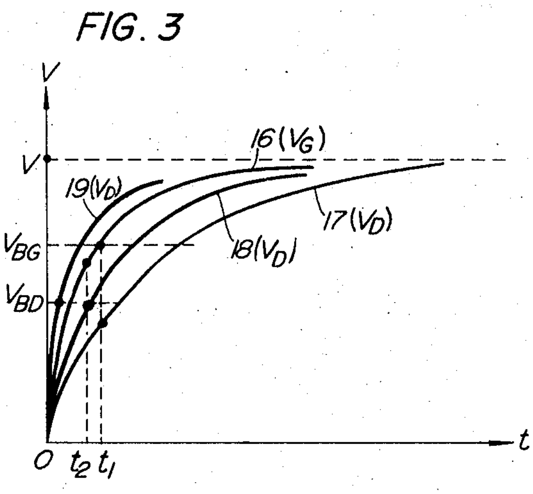
FIG. 3 is a diagram showing the electrical characteristics of an inventive circuit means in comparison with a prior art.

(2) It may be presumed that the diode before breakdown consists equivalently of a series circuit of the resistance R and of a capacitance $C_d$ (this is the capacitance of about 2 pf. existing at the PN junction of the diode) while the gate input circuit of the transistor consists equivalently of a series circuit of a capacitance $C_G$ (this is the actual capacitance of about 4 pf. existing between the gate electrode and the source region) and a resistance $r_s$ (this is the resistance of about 50 to 100Ω existing in the source region 3). The capacitances $C_d$ and $C_G$ are charged in accordance with each time constant $\tau_D$ of about 1 to 2 nsec. and $\tau_G$ of about 0.2 to 0.4 nsec., respectively. When the surge voltage having a rapid transient characteristic is applied, the terminal voltage $V_D$ across the capacitance $C_D$ (i.e. across the junction portion of the diode D) and the terminal voltage $V_G$ across the capacitance $C_G$ (i.e. across the insulating film between the gate electrode and the source region) vary with time as shown in FIG. 3.

Since the source region has generally a high impurity concentration and hence an extremely low resistivity, the resistance $r_s$ is much smaller, (for example, 50 to 100Ω) than the resistance R. The variations with time of the voltages $V_G$ and $V_D$ become respectively as shown by the curves 16 and 17 in FIG. 3. The curves 16 and 17 have a time constant of about 0.2 nsec. and 1.0 nsec., respectively.

As described above, the breakdown voltage $V_{BD}$ of the diode, for example, 60 volts is fixed at lower level than $V_{GB}$ of the gate insulating film, for example, 100 volts. When the transient effect is not considered, it is expected that the gate input voltage is clamped at $V_{BD}$. Actually, however, the gate voltage $V_G$ rises higher as shown by the curve 16 in FIG. 3. At time $t_1$ when $V_G$ reaches $V_{BG}$, the voltage $V_D$ of the diode is still lower than $V_{BD}$. Then the breakdown of the field effect transistor precedes that of the diode and the functioning of the diode becomes useless.

Therefore, according to some preferred embodiments of this invention the parasitic resistance (i.e. R in FIG. 2) in series with the protective diode is made much smaller than the impedance ($r$ in FIG. 2) of the signal source generating a surge noise voltage so that the voltage drop across the resistance R becomes substantially negligible. For instance, it is preferable that the value of the resistance R does not exceed 200Ω. The voltage between the gate and source electrodes is precisely clamped at the breakdown voltage $V_{BD}$ of the diode, protecting thus the field effect transistor from a breakdown. The time constant $\tau_D$ of the clamp diode circuit determined by the value of $C_d \times R$ is made nearly equal to (curve 18 is FIG. 3) or less than (curve 19) the time constant $\tau_G$ of the input circuit of the field effect transistor connected in parallel with the diode, the time constant $\tau_G$ being determined by $C_G \times r_s$. If circumstances require it, as shown in FIG. 11 a resistor $R_1$ in series between the clamp diode electrode and the gate electrode may be connected to make the time constant $\tau_G$ large or close to $\tau_D$. The terminal voltage of the clamp diode thereby increases earlier up to the breakdown voltage $V_{BD}$, preventing the field effect transistor from breaking down.

As evident from a comparison between the curves 16 and 18 in FIG. 3, it should be understood that the time constant $\tau_D$ of the diode circuit need not necessarily be smaller than the time constant $\tau_G$ of the gate input circuit, namely it is sufficient that the terminal voltage $V_D$ reaches $V_{BD}$ a $t=t2$ before the gate voltage $V_G$ reaches $V_{BG}$ at $t=t_1$. But in order to further perfectly protect the transistor it is especially desirable that the time constant $\tau_D$ is selected smaller than the time constant $\tau_G$ as shown by the curve 19 in FIG. 3.

Concrete embodiments of this invention will be explained hereunder with reference to the drawings.

EMBODIMENT 1

In a semiconductor device shown in FIGS. 4*a* and 4*b*, 20 is a low resistivity silicon substrate of first conductivity type, e.g. an N-type silicon, having a thickness of 100 to 200μ, the resistivity being preferably equal to or less than 0.1Ω cm. The layer 21 is a high resistivity silicon layer of first conductivity type formed on the substrate 20, the resistiivty being 1 to 5Ω cm. and the thickness being about 6 to 10μ. The layers 22 and 35 are insulating layers, e.g. silicon oxide layers, covering the semiconductor layer 21 and having a thickness of about 1,000 to 10,000 A. The regions denoted 23, 24 and 25 are source and drain regions and a part of the diode region, respectively, having an opposite conductivity type to that of the substrate and having a depth of about 2 to 6μ. Layers 26, 27, 28, 29 and 31 are respectively metal layers forming a source electrode, a drain electrode, a gate electrode, a protective diode electrode, and an interconnection layer extending over the insulating layer 22 to connect the diode electrode 29 with the gate electrode 28. The member denoted 32 is a substrate electrode in resistive contact with the substrate 20, serving as the other electrode of the diode. The PN junctions 37, 38 and 39 are formed between the substrate and the regions 23, 24 and 25, respectively.

This structure enables the spread resistance R between the PN junction 39 of diode and the substrate electrode 32 to be extremely small. For example, when the resistivity of the substrate is 0.1Ω cm. or 0.01Ω cm., R can be made about 50 to 100Ω or about 10Ω respectively. The spread resistance R can be much smaller than the impedance $r$ of the signal source generating a surge noise voltage, and nearly equal to or less than the series parasitic resistance $r_s$ of the gate input circuit. In this embodiment the condition $\tau_G \geqq \tau_D$ is satisfied because $C_D$ is estimated to about 2 pf., $C_G$ about 4 pf. and $r_s$ about 50Ω. Thus the gate input voltage of the semiconductor device is substantially clamped near the breakdown voltage $V_{BD}$, for example, at about 60 volts of the protective diode, and the field effect transistor is precisely prevented from breakdown. As a result of measurements it is found that the breakdown voltage $V_{BG}$ of the $SiO_2$ film beneath the gate electrode is about 100 to 130 volts.

Figure 5A:
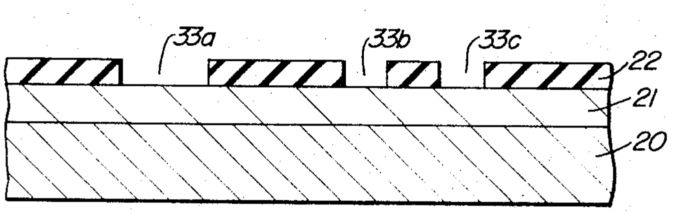

Concrete manufacturing steps of the semiconductor device is shown in FIGS. 5*a* to 5*d*. In FIG. 5*a*, 20 is an $N^+$ type silicon monocrystalline substrate having a resistivity of 0.01Ω cm., 21 an N type silicon layer of resistivity 1.5Ω cm. formed on the substrate 20 by the epitaxial growth and 22 is an $SiO_2$ layer made by the thermal growth on the epitaxial layer 21.

This $N^+N$ epitaxial semiconductor member has been used for the manufacture of a junction transistor but not for the insulated gate type field effect transistor. The reasons are the following.

(1) The resistivity of the substrate should be preferably high for the formation of a channel layer in which an electric current flows.

(2) There is no need of using the expensive epitaxial wafer as no large current flows through the substrate.

In this embodiment according to this invention the epitaxial wafer is used for the purpose of reducing the parasitic resistance connected in series with the clamping diode.

Figure 5B:
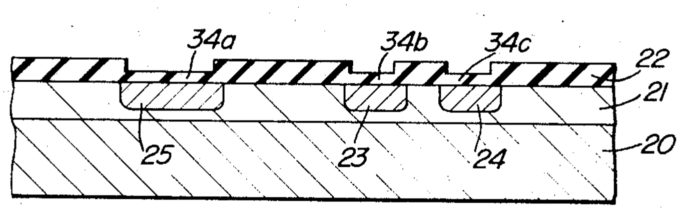

First as shown in FIG. 5*a*, with the use of the well known photoetching technique a plurality of holes 33*a*, 33*b*, and 33*c* reaching the semiconductor layer 21 are perforated into the $SiO_2$ film 22. Next as shown in FIG. 5*b*, a P-type impurity (e.g. boron) is diffused through the holes 33*a*, 33*b* and 33*c* to form P-type regions 23, 24 and 25 having a surface impurity concentration of about $10^{18}$ to $10^{19}$ atoms/cm.$^3$ respectively. As the diffusion is performed in the oxydizing atmosphere, thin $SiO_2$ layers 34*a*, 34*b* and 34*c* are again formed in the holes 33*a*, 33*b* and 33*c*.

Figure 5C:
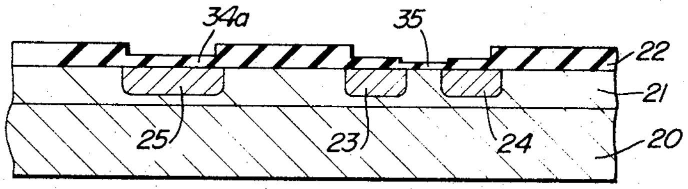
Figure 5D:
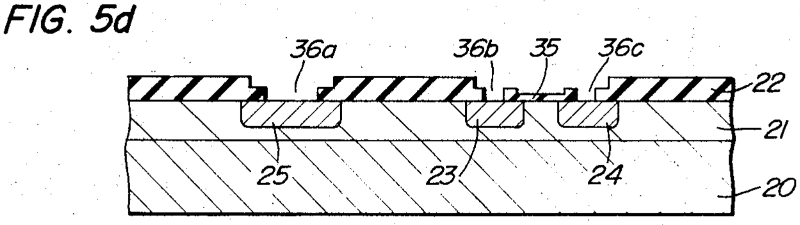

In FIG. 5*c* in order to increase the mutual conductance of the field effect transistor, the $SiO_2$ film 35 for a gate electrode is made as thin as about 1,000 to 2,000 A. while the thicker portion 22 thereof is 5,000 to 10,000 A. The thin $SiO_2$ layer 35 can be obtained by etching the $SiO_2$ layer 22 selectively and thereafter growing a new $SiO_2$ layer thereon. The $SiO_2$ portions for the formation of electrodes are removed as shown in FIG. 5*d* to form holes 36*a*, 36*b* and 36*c*. And then metal electrode layers are formed by depositing aluminum on the substrate as shown in FIG. 4*b*. The substrate 20 is soldered to the support metal electrode 32, obtaining thus the semiconductor device as shown in FIGS. 4*a* and 4*b*.

It is necessary in this semiconductor device that the P-type drain region 24 (see FIG. 4*b*) and the low resistivity semiconductor substrate 20 are kept at a sufficient interval or spacing therebetween so that a depletion layer extending from the junction 38 when applying a drain bias voltage to the region 24, will not reach the region 20. However, a large interval therebetween means a large spread resistance R, which is an unfavorable situation. In this embodiment, therefore, it is desirable that the interval be selected from about 2 to 8$\mu$. And the clamping diode is formed about 50$\mu$ square.

When the breakdown voltage of the clamping diode junction 39 is too high, it may be well to introduce an N-type impurity preliminarily before the formation of a P-type region 82, thereby to form an N-type low resistivity region 81 as shown in FIG. 10. In order to further reduce the spread parasitic resistance R, the electrode 80 may be made to surround the P-type region 25 or 82 as shown in FIGS. 9*a* and 9*b* or in FIG. 10 respectively. And the electrode 80 may be connected to the source electrode 26 and/or to the substrate electrode 32 (not shown in drawings).

EMBODIMENT 2

Next, another embodiment according to this invention will be explained.

FIGS. 6*a* and 6*b* show a semiconductor device comprising a high resistivity semiconductor substrate, e.g. an N-type silicon substrate 40 having a resistivity of 1Ω cm.; an $SiO_2$ film 41 having a thickness of 1,000 to 10,000 A.; an N-type diffused low resistivity region 42; P-type diffused source, drain, and diode regions 43, 44 and 45; metal, e.g. aluminum, layers 46, 47, 48, 49, 51 and 53; and a support electrode 52. The field effect transistor portion comprising a source region 43, a drain region 44, a source electrode 46, a drain electrode 47 and a gate electrode 48 is made by a conventional method or a similar method to that of the above embodiment. The N-type region 42 at the clamp diode portion has a lower resistivity (e.g. 0.5Ω cm.) than that of the substrate 40, and the PN junction formed between the P-type region 45 and the N-type region 42 is formed shallower than the one at the P-type source region 43 or the drain region 44. This shallower PN junction structure has the advantage of decreasing the breakdown voltage of the diode. The electrode 53 surrounds the P-type diffused region 45 to reduce the spread resistance existing in series with the diode and, as shown in FIG. 12, it may be interconnected to the source electrode 46 through a metal layer 53' extending over the $SiO_2$ film 41.

Figure 8A:
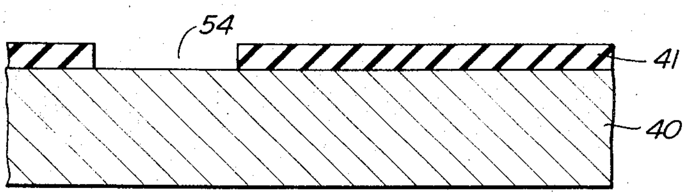
Figure 8B:
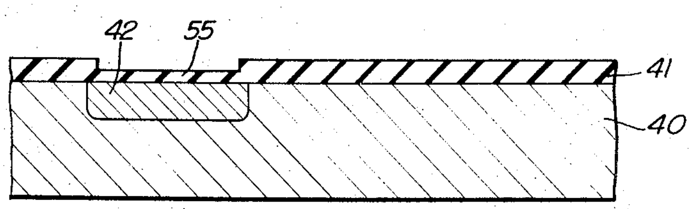
Figure 8C:
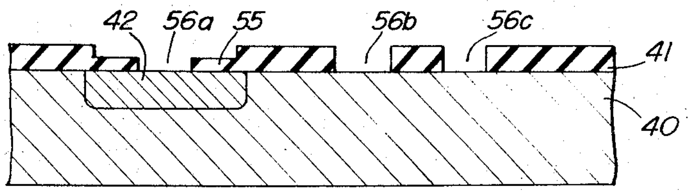
Figure 8D:
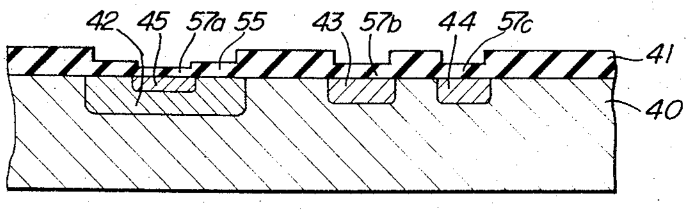

The manufacturing steps of this semiconductor device 50 are shown in FIGS. 8*a* and 8*b*. First as shown in FIG. 8*a*, a hole 54 is perforated into the $SiO_2$ film 41. As shown in FIG. 8*b*, an N-type impurity is diffused into the N-type substrate 40 through the opening 54. The concentration of the introduced N-type impurity is adjusted in accordance with the desired breakdown voltage of the diode. In the above diffusion process an $SiO_2$ film 55 is again formed in the hole 54. Next as shown in FIG. 8*c*, a plurality of holes 56*a*, 56*b* and 56*c*, through which a P-type impurity is diffused as shown in FIG. 8*d* to form P-type regions 43, 44 and 45, are perforated. $SiO_2$ layers 57*a*, 57*b* and 57*c* are formed again in the holes 56*a*, 56*b* and 56*c* respectively. The P-type region 45 formed in the N-type region 42 by this diffusion process has a shallower depth than that of P-type region 43 or 44, the impurity concentration of the region 42 being larger than that of the substrate region 40. Thereafter the portion of the $SiO_2$ layer covering the substrate surface between the regions 43 and 44 is made to have a thickness of about 1,000 to 2,000 A., a plurality of holes are formed in the $SiO_2$ layer 57*a*, 57*b* and 57*c*, and then aluminum layers are deposited by vapor phase disposition, obtaining thus a semiconductor device shown in FIGS. 6*a* and 6*b*.

EMBODIMENT 3

Next, a further embodiment according to this invention will be explained.

The semiconductor device shown in FIG. 7 has the same field effect transistor structure as that of the semiconductor device shown in FIGS. 6*a* and 6*b*. But the $N^+$ type region 62 at the clamp diode in FIG. 7 is formed ring-like, containing a P-type region 65 therein while that in FIGS. 6*a* and 6*b* is dish-like. In this respect, the device shown in FIG. 7 is different from the device in FIG. 6*b*.

The breakdown voltage of the clamp diode can be controlled by the impurity concentration of the N-type region 62. In order to reduce the spread resistance, an electrode 73 is fitted to the N-type region 62 to surround the P-type region 65 in a similar manner to that of the electrode 53 in FIGS. 6*a* and 6*b*.

In said further embodiment of this invention the surface impurity concentration of the low resistivity semiconductor regions 42, 62 or 81 shown in FIGS. 6*a* and 6*b*, FIG. 7, or FIG. 10 respectively is selected high enough to prevent the undesirable parasitic field effect phenomenon caused by a voltage application to the interconnection layer, which appears between the field effect transistor regions and the protective diode region in the surface of the semiconductor substrate. Referring to FIGS. 6*a* and 6*b* for example, the low resistivity diffused layer 42 contributes not only to decrease the resistance R but also in the case of a signal voltage application to the interconnection layer 51, to prevent a short-circuit between the P-type diode region 45 and the P-type source and/or drain regions by means of a P-channel appearing in the substrate surface under the interconnection layer 51. Thus the complete clamping action of the diode is assured.

The low resistivity regions 42, 62, or 81 inserted between the two electrode terminals of the diode have the advantage of decreasing the reverse breakdown voltage $V_{BD}$ of the protective diode. It is seen in FIG. 3 that in a field effect transistor with a clamping diode having a lower breakdown voltage, the breakdown of the diode occurs much earlier than the time $t_1$ when the gate insulator suffers a dielectric breakdown and that the value $(t_1-t_2)$ can be made larger.

Although in the above embodiments the protection of a P channel MIS field effect transistor has been particularly shown and described, this invention can also be applied to one involving an N-channel depletion mode. In this case one portion of the low resistivity region may be exposed to surround the protective diode region and cut off the reversed N-type surface layer generated due to the insulating layer.

Although in the above embodiment the semiconductor substrate is made of silicon, other semiconductors such as germanium, and intermetallic compounds may be used. In the case of an intermetallic compound, the semiconductor insulator cannot be made by thermal growth from substrate but should be deposited by vapor phase disposition. The insulator may be silicon nitride and glass etc. as well as silicon oxide.

When the signal source impedance is extremely small, in order to make it larger than the resistance R of the clamp diode it is desirable to insert a resistor $R_2$ of several hundred ohms between the input terminal and the electrode 9 of the clamp diode D as shown in FIG. 11. The resistor has the practical advantage of decreasing the effect of the parasitic resistance R inserted in series with the diode.

What is claimed is:

1. A field effect semiconductor device with a protective means comprising:

a semiconductor substrate of first conductivity type having a principal surface, said substrate comprising a first region of a relatively low resistivity and a second region of a relatively high resistivity, said second region being exposed to at least one portion of said principal surface;

a field effect component including an insulating film formed on at least one portion of the exposed portion of said second region, and a first metal electrode formed on one portion of said film;

a protective means including a third semiconductive region of second conductivity type opposite to said first conductivity type formed in another surface portion of said principal surface of said semiconductor substrate separately from the surface portion below said first metal electrode, said third semiconductive region defining, with the adjacent semiconductive material of said first conductivity type in said semiconductive substrate, a PN junction having a backward breakdown voltage lower than the breakdown voltage of said insulating film interposed between said first metal electrode and said semiconductor substrate, and a second metal electrode electrically connected to said third semiconductive region;

a conductive means for connecting said first metal electrode with said second electrode;

a third metal electrode connected to said first region; and an input terminal connected to said second metal electrode;

said first region extending substantially wholly between said third semiconductive region and said third electrode and having a resistivity low enough to reduce the time constant of an equivalent circuit including said protective means and crossing said PN junction to a value which is substantially the same as or smaller than the time constant of an equivalent circuit including said field effect component and crossing said insulating film below said first metal electrode, whereby, when an input voltage higher than the breakdown voltage of said insulating film below said first metal electrode is applied to said input terminal, the voltage appearing across said PN junction reaches the breakdown voltage of said PN junction before the voltage appearing across the insulating film below said first metal electrode reaches the breakdown voltage of said insulating film to prevent the insulating film from electrical breakdown.

2. A field effect semiconductor device according to claim 1, wherein said field effect component further comprises a pair of semiconductive regions of said second conductivity type formed in said principal surface of said substrate, said first metal electrode being disposed to cover the surface portion between said pair of semiconductive regions, and electrodes connected to said pair of semiconductive regions, respectively.

3. A field effect semiconductor device according to claim 2, wherein said semiconductor substrate of first conductivity type comprises an N type silicon material and said insulating film comprises a silicon inorganic compound.

4. A field effect semiconductor device according to claim 1, wherein said PN junction is formed between said third region and said first region, said first region is exposed to one portion of said principal surface, and said third metal electrode is formed on said surface portion of said first region exposed to said principal surface.

5. A field effect semiconductor device according to claim 4, wherein said surface portion of said first region exposed to said principal surface surrounds said third semiconductive region and said third metal electrode is formed to substantially surround said third region.

6. A field effect semiconductor device according to claim 4, wherein in the principal surface of said substrate said first region is formed like a dish containing said third semiconductive region therein, and said third metal electrode is provided on the exposed portion of said first region to surround almost entirely the third semiconductive region.

7. A field effect semiconductor device of claim 4, wherein in the principal surface of said substrate said first region is formed annularly to surround said third semiconductive region, the third semiconductive region is formed to contact with the inside wall of said first annular region, and said third metal electrode is provided on the exposed portion of said first region to surround substantially entirely the third semiconductive region.

8. An insulated gate type field effect transistor having a protective diode which comprises:

a first conductivity type semiconductor substrate having a relatively low resistivity layer, and a relatively high resistivity layer formed on said relatively low resistivity layer, said relatively high resistivity layer having a principal surface;

a source region and a drain region each of a second conductivity type and a diode region separately formed in said principal surface;

an insulating film covering at least the principal surface of said layer between said source and drain regions;

a gate metal electrode disposed on said insulating film between said source and drain regions;

a source electrode and a drain electrode connected to said source and drain regions respectively; and a conducting means for connecting said gate electrode with said diode region;

said diode region forming with said semiconductor substrate a rectifying barrier which has a backward breakdown voltage lower than the breakdown voltage of said insulating film between said gate metal electrode and said semiconductor substrate, said relatively low resistivity layer having a resistivity low enough to reduce the time constant of an equivalent circuit crossing said rectifying barrier to a value which is substantially the same as or smaller than the time constant of an equivalent circuit crossing said insulating film below said gate metal electrode, whereby, when a voltage higher than the breakdown voltage of said insulating film below said gate metal electrode is applied to said diode region, the voltage appearing across said rectifying barrier reaches the breakdown voltage of said rectifying barrier before the voltage appearing across said insulating film below said gate metal electrode reaches the breakdown voltage of said insulating film, thereby to prevent the insulating film from electrical breakdown.

9. An insulated gate type field effect transistor according to claim 8, wherein said first conductivity type semiconductor substrate comprises N type silicon and said insulating film comprises silicon oxide.

10. An insulated gate type field effect transistor according to claim 9, wherein the resistivity of said relatively low resistivity layer is not more than 0.1Ω cm., the resistivity of said relatively high resistivity layer is not less than 1Ω cm., said insulating film has a thickness of about 1,000 to 2,000 A.

11. An insulated gate type field effect transistor of claim 8 further comprising an additional electrode connected with said relatively low resistivity layer of said first conductivity type semiconductor substrate in an ohmic contact relation therewith and means for connecting said additional electrode with a common reference potential.

12. A semiconductor body of first conductivity type, a pair of source and drain regions of second conductivity type opposite to said first conductivity type formed in a surface of said body, an insulating film formed on said surface of the body to cover at least the surface portion between said source and drain regions, and a gate electrode formed on said insulating film to cover the surface portion between said source and drain regions; a diode including said semiconductor body and a region of said second conductivity type forming a PN junction with said body therebetween, said PN junction having a backward breakdown voltage lower than the breakdown voltage of said insulating film interposed between said gate electrode and said body; an input terminal, and means assuring voltage breakdown of said PN junction prior to voltage breakdown of the insulating film interposed between said gate electrode and said body including a first resistance component connected between said gate electrode and said region of said diode and a second resistance component connected between said input terminal and said region of said diode.

13. A semiconductor device comprising:

a semiconductor substrate of a first conductivity type;

a field effect semiconductor component including an insulating film formed on a surface of said substrate, a conductive layer formed on the insulating film, and one surface part of said semiconductor substrate below said conductive layer;

a protecting component including a region contacting said substrate of said first conductivity type to form a rectifying barrier having a backward breakdown voltage lower than the breakdown voltage of said insulating film between said conductive layer and said substrate;

an electrode means ohmically connected to said substrate;

a first conducting means for electrically connecting said region of said protecting component with said conductive layer of said field effect semiconductor component;

a second conducting means for connecting said electrode means with a common reference potential;

an input terminal to which an input is applied;

a third conducting means for connecting said input terminal with said region of said protecting component; and fourth means formed at least in part in the circuit path through said rectifying barrier for reducing the time constant of the equivalent circuit appearing between said region of said protecting component and the common reference potential and crossing said rectifying barrier, to a value substantially the same as or smaller than the time constant of the equivalent circuit appearing between said region of said protecting component and said common reference potential and crossing said insulating film between said conductive layer of said field effect semiconductor component.

14. A semiconductor device of claim 13 wherein said fourth means comprises a low resistivity semiconductor substrate between said protecting component and said electrode means connected to said substrate, said low resistivity semiconductor region having a resistivity not more than 0.1Ω cm.

15. A semiconductor device of claim 13, wherein said fourth means comprises said electrode means formed in the vicinity of said region of said protecting component to substrantially surround the periphery of said region of said protecting component exposed to a surface of said semiconductor substrate.

16. A semiconductor device of claim 13, further comprising a resistance connected between said region of said protecting component and said input terminal in series with said third conducting means.

17. A semiconductor device of claim 13, wherein said fourth means comprises a resistance connected between said region of said protecting component and said conductive layer of said field effect semiconductor component in series with said first conducting means.

18. An insulated gate type field effect transistor having a protective diode which comprises; a first conductivity type semiconductor substrate including a relatively low resistivity layer, a relatively high resistivity layer formed on said relatively low resistivity layer and having a principal surface, and a first conductivity type semiconductor region having a relatively low resistivity, contacting with said relatively low resistivity layer and extending to said principal surface; a pair off source and drain regions of a second conductivity type formed in said principal surface of said relatively high resistivity layer; a diode region formed in said first conductivity type semiconductor region; an insulating film covering at least the principal surface of said layer between said source and drain regions; a gate metal electrode disposed on said insulating film between said pair off source and drain regions; a source and drain electrodes connected to said source and drain regions respectively; and a conducting means for connecting said gate electrode with said diode region; said diode region forming with said first conductivity type semiconductor region a rectifying barrier which has a backward breakdown voltage lower than the breakdown voltage of said insulating film between said gate metal electrode and said semiconductor substrate.

19. A field effect semiconductor device having a protective means, comprising:

a semiconductor substrate having a major surface;

a field effect transistor including a first, high resistivity region of a first conductivity type formed in said substrate and extending to said major surface, a pair of second regions of a second conductivity type opposite to said first conductivity type formed in said first region, extending to said major surface and closely spaced from each other, an insulating film covering at least the portion of said major surface between said second regions, and a gate electrode formed on said insulating film between said second regions;

a protective component including a third region of said first conductivity type having a resistivity lower than that of said first region, formed locally in said substrate and extending to said major surface, and a fourth region of said second conductivity type formed in said third region, extending to said major surface having a depth from said major surface shallower than those of said second regions and defining, with said third region, a PN junction having a backward breakdown voltage lower than the breakdown voltage of said insulating film interposed between said gate electrode and said substrate; and a conductive means for connecting said fourth region with said gate electrode.

20. A semiconductor device comprising:

a semiconductor substrate having a major surface;

a field effect semiconductor component including an insulating film formed on said major surface of said substrate and a conductive layer formed on the insulating film;

a protective component including a region formed in said major surface of said substrate and defining, with the adjacent semiconductor material of said substrate, a rectifying barrier having a backward breakdown voltage of said insulating film between said conductive layer and said substrate, and a conductive means ohmically connected at said major surface to the semiconductor material adjacent to but closely spaced from said region of said protective component for connecting the latter semiconductor material to a common reference potential; and a means for connecting said region of said protective component with said conductive layer of said field effect semiconductor component.

21. A device of claim 20, wherein said conductive means includes a metal electrode connected to said semiconductor material so as to be spaced from and substantially completely surround said region of said protective component in said major surface.

22. A semiconductor device comprising:

a semiconductor substrate having a major surface;

a field effect semiconductor component including a first, high resistivity region of a first conductivity type formed in said substrate and extending to said major surface, a pair of second regions of a second conductivity type opposite to said first conductingg type formed in said first region, extending to said major surface and closely spaced from each other, and insulating film covering at least the portion of said major surface between said second regions, and a gate electrode formed on said insulating film between said second regions;

a protective component including a third region of said second conductivity type formed in said first region, spaced from said second regions, extending to said major surface and defining, with said first region, a PN junction having a backward breakdown voltage lower than the breakdown voltage of said insulating film below said gate electrode;

a first conductive means for connecting said gate electrode with said third region; and a second conductive means formed on said major surface for connecting the semiconductor material of said first region adjacent to but closely spaced from said third region with one of said second regions.

23. A semiconductor device comprising:

a semiconductor substrate of a first conductivity type having a major surface and including a first region of a relatively low resistivity exposed at one portion of said major surface and a second region of a relatively high resistivity contiguous to said first region and exposed at another portion of said major surface;

a field effect component including an insulating film formed on said second region at said other portion of said major surface and a first metal electrode formed on a part of said film;

a third region of a second conductivity type opposite to said first conductivity type formed in said first region at one portion of said major surface, electrically connected to said first metal electrode and defining, with said first region, a PN junction having a backward breakdown voltage lower than the electrostatic breakdown voltage of said insulating film below said first metal electrode;

a second metal electrode ohmically connected to said first region at said major surface in the vicinity of said PN junction, the second metal electrode being adapted to be connected to a common reference potential;

and an input terminal connected to said third region.

24. a semiconductor device according to claim 23, wherein said first region underlies said third region.

25. A semiconductor device according to claim 23, wherein said second metal electrode extends along and is closely spaced from the exposed edge portion of said PN junction in said major surface.

References Cited

UNITED STATES PATENTS

| | | | |
|---|---|---|---|
| 3,315,096 | 4/1067 | Carlson et al. | 317—235 |
| 3,354,006 | 11/1967 | Long et al. | 317—235 |
| 3,378,915 | 4/1968 | Zenner | 317—235 |
| 3,383,570 | 5/1968 | Luscher | 317—235 |
| 3,403,270 | 9/1968 | Pace et al. | 317—235 |
| 3,153,152 | 10/1964 | Hoffman | 307—318 |
| 3,454,891 | 7/1969 | Siegel | 317—235 |

JERRY D. CRAIG, Primary Examiner

U.S. Cl. X.R.

307—202, 237, 304

UNITED STATES PATENT OFFICE

CERTIFICATE OF CORRECTION

Patent No. 3,555,374 Dated January 12, 1971

Inventor(s) Koji USUDA

It is certified that error appears in the above-identified patent and that said Letters Patent are hereby corrected as shown below:

Column 9, line 49, change the entire line to read

-- 12. A semiconductor device comprising a field effect transistor including a semiconductor body of a first conductivity type, --

Signed and Sealed this

Fifth Day of October 1976

[SEAL]

*Attest:*

RUTH C. MASON
*Attesting Officer*

C. MARSHALL DANN
*Commissioner of Patents and Trademarks*

UNITED STATES PATENT AND TRADEMARK OFFICE

CERTIFICATE OF CORRECTION

PATENT NO. : 3,555,374

DATED : January 12, 1971

INVENTOR(S) : Koji Usuda

It is certified that error appears in the above-identified patent and that said Letters Patent are hereby corrected as shown below:

Column 11, Line 40: change the entire line to read -- breakdown voltage lower than the breakdown voltage of said insulating film between --

Signed and Sealed thi

*Twenty-third* Day of *Decembe*

[SEAL]

*Attest:*

SIDNEY A. DIAMOND

*Attesting Officer*

*Commissioner of Patents and Tra*